(12) United States Patent
Mueller-Mach et al.

(10) Patent No.: US 6,630,691 B1
(45) Date of Patent: *Oct. 7, 2003

(54) LIGHT EMITTING DIODE DEVICE COMPRISING A LUMINESCENT SUBSTRATE THAT PERFORMS PHOSPHOR CONVERSION

(75) Inventors: Regina B. Mueller-Mach, San Jose, CA (US); Gerd O. Mueller, San Jose, CA (US); David A. Vanderwater, Santa Clara, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/407,231

(22) Filed: Sep. 27, 1999

(51) Int. Cl.⁷ ............................................... H01L 27/15
(52) U.S. Cl. ............................. 257/84; 257/16; 257/98; 257/103; 313/472
(58) Field of Search .................. 257/94, 98–103, 257/13–18, 76–82, 20, 22, 84, 95, 96; 313/499–504, 456–472, 505, 473; 372/10–14, 66–75

(56) References Cited

U.S. PATENT DOCUMENTS

| | | | | |
|---|---|---|---|---|
| 5,193,096 A | * | 3/1993 | Amano | 372/13 |
| 5,862,167 A | * | 1/1999 | Sassa et al. | 372/45 |
| 5,998,925 A | * | 12/1999 | Shimuzu et al. | 313/503 |
| 6,239,901 B1 | * | 5/2001 | Kaneko | 359/326 |
| 6,291,839 B1 | * | 9/2001 | Lester | 257/91 |
| 6,310,364 B1 | * | 10/2001 | Uemura | 257/100 |
| 6,337,536 B1 | * | 1/2002 | Matsubara et al. | 313/498 |

FOREIGN PATENT DOCUMENTS

| | | | | |
|---|---|---|---|---|
| EP | 0 971 421 | | 1/2000 | H01L/33/00 |
| EP | 0 977 278 | | 2/2000 | H01L/33/00 |
| GB | 2000173 A | * | 1/1979 | |
| JP | 10 056203 | | 2/1998 | H01L/33/00 |

* cited by examiner

*Primary Examiner*—Minh Loan Tran
*Assistant Examiner*—Thomas L Dickey
(74) *Attorney, Agent, or Firm*—Patent Law Group LLP; Rachel V. Leiterman

(57) ABSTRACT

The present invention provides an LED device comprising a phosphor-converting substrate that converts primary light emitted by the LED, which is blue light, into one or more other wavelengths of light, which then combine with unconverted primary light to produce white light. The substrate is a single crystal phosphor having desired luminescent properties. The single crystal phosphor has the necessary lattice structure to promote single crystalline growth of the light-emitting structure of the LED device. Moreover, the thermo-mechanical properties of the substrate are such that the introduction of excessive strain or cracks in the epitaxial films of the LED device is prevented. The characteristics of the substrate, i.e., the dopant concentration and thickness, are capable of being precisely controlled and tested before the LED device is fabricated so that the fraction of primary light that passes through the substrate without being converted is predictable and controllable. Likewise, the fraction of primary light that is converted by the substrate into one or more other wavelengths is predictable and controllable. By precisely controlling these fractions, phosphor-converted LED devices can be achieved that produce uniform, high-quality white light.

30 Claims, 2 Drawing Sheets

WHITE LIGHT

LIGHT EMITTING DIODE DEVICE COMPRISING A LUMINESCENT SUBSTRATE THAT PERFORMS PHOSPHOR CONVERSION

TECHNICAL FIELD OF THE INVENTION

The present invention relates to light emitting diode (LED) devices and, more particularly, to an LED device comprising a phosphor-converting substrate that converts a fraction of the primary light emitted by a light emitting structure of the LED into one or more other wavelengths of light that combine with unconverted primary light to produce white light.

BACKGROUND OF THE INVENTION

With the development of efficient LEDs that emit blue or ultraviolet (UV) light, it has become feasible to produce LEDs that generate white light through phosphor conversion of a portion of the primary emission of the LED to longer wavelengths. Conversion of a portion of the primary emission of the LED to longer wavelengths is commonly referred to as down-conversion of the primary emission. An unconverted portion of the primary emission combines with the light of longer wavelength to produce white light. LEDs that produce white light are useful for signaling and illumination purposes.

Currently, state-of-the-art phosphor conversion of a portion of the primary emission of the LED is attained by placing a phosphor in an epoxy that is used to attach the LED to a reflector cup, which houses the LED within the LED lamp. The phosphor is in the form of a powder that is mixed into the epoxy prior to curing the epoxy. The uncured epoxy slurry containing the phosphor powder is then deposited onto the LED and is subsequently cured.

The phosphor particles within the cured epoxy generally are randomly oriented and interspersed throughout the epoxy. A portion of the primary light emitted by the LED passes through the epoxy without impinging on the phosphor particles, whereas a portion of the primary light emitted by the LED impinges on the phosphor particles, thereby causing the phosphor particles to emit yellow light. The combination of the primary blue light and the phosphor-emitted yellow light produces white light.

One disadvantage of utilizing the epoxy comprising the phosphor particles is that uniformity in the white light emitted by the LED is difficult, if not impossible, to obtain. This non-uniformity is caused by non-uniformity in the sizes of the phosphor particles mixed into the epoxy slurry. Currently, phosphor powders having uniform phosphor particle sizes generally are not available. When the phosphor powder is mixed into the epoxy slurry, the larger phosphor particles sink faster than the smaller phosphor particles. This non-uniformity in spatial distribution of the phosphor particles exists in the epoxy once it has been cured.

Therefore, obtaining a uniform distribution of the phosphor particles within the epoxy is very difficult, if not impossible, due to the non-uniformity of the sizes of the phosphor particles. This inability to control the sizes of the phosphor particles and their locations within the epoxy results in difficulties in producing LED lamps that emit white light in a uniform manner. Therefore, the quality of the white light produced by LED lamps may vary from one lamp to another, even for a given model manufactured by a particular manufacturer.

Attempts have been made to overcome the disadvantages of using epoxies mixed with phosphor powders by placing luminescent organic dye films on a lens that encases the LED. The dye is carefully positioned on the lens at a particular location so that it totally absorbs all of the primary light impinging thereon and converts the primary light to light of a longer wavelength. A fraction of the primary light emitted passes through the lens without impinging on the dye. The primary light that does not impinge on the dye then combines with the longer-wavelength light to produce white light. Since the dye totally absorbs the primary light impinging thereon, any variation in the fraction of the primary light that is summed with the longer-wavelength light is supposed to be eliminated.

However, this latter approach also has several disadvantages. The placement of the dye on the lens is subject to manufacturing uncertainties, which may result in variations in the white light produced. Also, dyes that are stable over long periods of time generally are not available. As a result, wide spread use of phosphor-converting dyes has not occurred.

Accordingly, a need exists for an LED device that performs phosphor conversion and that overcomes the aforementioned problems and disadvantages.

SUMMARY OF THE INVENTION

The present invention provides an LED device comprising a phosphor-converting substrate that converts primary light emitted by the LED, which is either blue or ultraviolet light, into one or more other wavelengths of light, which then combine with unconverted primary light to produce white light. The substrate is a single crystal phosphor having desired luminescent properties. The single crystal phosphor has the necessary lattice structure to promote single crystalline growth of the light-emitting structure of the LED device. Moreover, the thermo-mechanical properties of the substrate are such that the introduction of excessive strain or cracks in the epitaxial films of the LED device is prevented. The dopant concentration and thickness of the substrate are capable of being precisely controlled and tested before the LED device is fabricated, which allows the fraction of primary light that passes through the substrate without being converted to be predicted and controlled. Likewise, the fraction of primary light that is converted by the substrate into one or more other wavelengths is predictable and controllable. By precisely controlling these fractions, phosphor-converted LED devices can be achieved that produce uniform, high-quality white light.

In accordance with the preferred embodiment of the present invention, the substrate is comprised as a single crystal phosphor. The substrate preferably is a single crystal Cerium-doped Yttrium-Aluminum-Garnet ($Y_3Al_5O_{12}:Ce^{3+}$) compound, also denoted as YAG:Ce. The substrate luminesces yellow light in response to receiving primary light generated by the light emitting structure of the LED. A portion of the primary light generated by the light emitting structure of the LED passes through the substrate and remains unconverted. The unconverted primary light, which is blue light, then combines with the yellow light to produce white light.

In accordance with one embodiment of the present invention, the substrate converts only a portion of the primary blue light emitted by the light emitting structure of the LED into light yellow light. The yellow light then combines with the unconverted primary blue light to produce white light. In accordance with another embodiment of the present invention, the substrate is sandwiched between the light emitting structure and a reflective surface. The substrate absorbs all of the primary light propagating into the substrate and converts it into yellow light. The yellow light is reflected by the reflective surface toward the light emitting structure. The yellow light passes through the light emitting structure and combines with primary light emitted by the light emitting structure in a direction away from the substrate. The combined light produces white light.

Other features and advantages of the present invention and variations thereof will become apparent from the following description, drawings and claims.

DETAILED DESCRIPTION OF THE INVENTION

Figure 1:
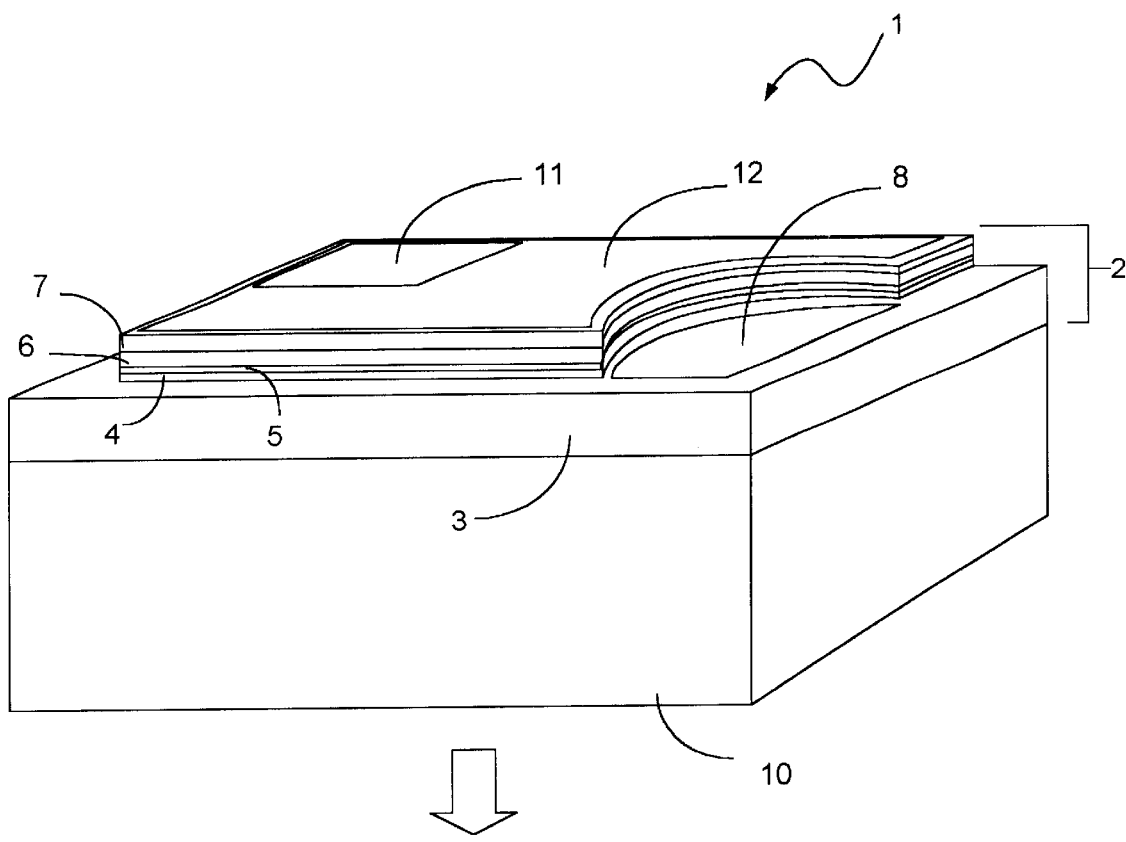
FIG. 1 is a perspective view of the light emitting diode device of the present invention comprising a phosphor-converting substrate.

FIG. 1 is a perspective view of a light emitting diode (LED) 1 that is suitable for incorporating a phosphor-converting substrate of the present invention. However, it should be noted that the LED of the present invention is not limited to any particular LED. Those skilled in the art will understand that a variety of LEDs are available on the market that are suitable for use with the present invention.

The LED 1 may comprise, for example, a light emitting structure 2, which comprises two n-GaN layers 3 and 4, an SQW or MQW GaInN layer 5, a p-AlGaN layer 6 and a p-GaN layer 7. The light emitting structure 2 also comprises an n-electrode bond pad 8, an n-electrode 3, a p-electrode bond pad 11 and a p-electrode 12. The n-electrode 3 is comprised of GaN and the p-electrode 12 is either transmissive or reflective, as discussed below in more detail. Preferably, the p-electrode is reflective and the light emitted by the light emitting structure propagates downward and into the substrate 10. The electrode bond pads 8 and 11, when connected to a power supply (not shown), provide the biasing current for causing the LED 1 to emit light.

The light emitting structure 2 is disposed on a substrate 10, which is a single crystal phosphor. It should be noted that the materials used for creating the light emitting diode 1 are not limited to the materials discussed above with reference to FIG. 1. Those skilled in the art will understand that the light emitting diode 1 can be comprised of various types of materials. As stated above, the light emitting diode 1 is not limited to any particular type of light emitting diode, with the exception that the light emitting diode device utilized in accordance with the present invention emits a primary light that is either blue or UV, as discussed below in detail. Those skilled in the art will understand that various light emitting diodes are known that are suitable for this purpose. For example, single-quantum-well and multiple-quantum-well light emitting diodes are suitable for this purpose.

The light emitting structure 2 that generates the blue primary emission preferably is grown epitaxially on the single crystal phosphor substrate 10. The substrate 10 preferably is a single crystal Cerium-doped Yttrium-Aluminum-Garnet ($Y_3Al_5O_{12}:Ce^{3+}$) compound. The Yttrium-Aluminum-Garnet phosphor compound is commonly referred to as "YAG". Substrates such as Silicon Carbide (SiC) and a form of Aluminum Oxide ($Al_2O_3$) known as Sapphire, are typically used in LED devices because they have desirable thermal, mechanical and crystalline structure properties. Although Aluminum Oxide has the thermal, mechanical and crystalline structure properties that are needed for a suitable substrate, the lattice structure of this compound is too dense to allow rare earth ions to be incorporated into it in sufficient concentrations to enable it to perform phosphor conversion.

As is understood in the art, the substrate utilized in an LED device must closely match the crystalline structure of the n-electrode. As stated above, the n-electrode 3 of the LED device 1 of the present invention preferably is comprised of GaN. In accordance with the present invention, it has been determined through research and experimentation that a single crystal YAG compound has a crystalline structure that sufficiently matches the crystalline structure of GaN such that it is suitable for use as the substrate of the LED device 1.

In accordance with the present invention, it has been determined through research and experimentation that a single crystal YAG compound also has the thermal, mechanical and crystalline structure properties that make it suitable for use as the substrate of an LED device. Since it is known that YAG can be doped with Cerium to produce a yellow-light-emitting phosphor, it has been determined, in accordance with the present invention, that a single crystal Cerium-doped YAG compound can serve the dual purpose of providing all of the necessary functions of an LED device substrate and of generating phosphor-converted emissions.

The substrate material could also be comprised of other materials. For example, the substrate material could be (Y,Al) oxides which do not have garnet structures, which is what the "G" represents in "YAG". For example, monoklinic YAlO and YAlO-perovskite. Several lathanides (Ln), partly replacing Y, are also suitable for this purpose, such as, for example, (Y,Ln)AlO, (Y,Ln)(Al,Ga)O, where Ln represents any rare earth ion. The lanthanide could be Lutethium, Lu, which is known for promoting good luminescence properties. It should also be noted that various dopants could be used for doping the substrate material, including single dopants, such as, Ce, Pr, Ho, Yb; Eu2+, and double dopants such as (Ce,Pr), (Ce,Ho), and (Eu,Pr).

Another example of a single crystal substrate that is suitable for this purpose is a single crystal Holmium-doped Yttrium-Aluminum-Garnet ($Y_3Al_5O_{12}$:$Ho^{3+}$) compound. Yet another example of a single crystal substrate that is suitable for this purpose is a single crystal Praseodymium-doped Yttrium-Aluminum-Garnet ($Y_3Al_5O_{12}$:$Pr^{3+}$) compound. However, those skilled in the art will understand that the present invention is not limited to using any particular type of phosphor for this purpose. Those skilled in the art will understand that a plurality of different types of phosphors exist that are suitable for this purpose.

The substrate 10 luminesces yellow light in response to receiving primary light generated by the light emitting structure 2 of the LED, which is blue light. A portion of the primary light generated by the light emitting structure 2 of the LED passes through the substrate 10 and remains unconverted. The primary light is represented by arrow 22 in FIG. 2. The yellow light is represented by arrow 23 in FIG. 2. The unconverted primary light then combines with the yellow light to produce light that is very close to white light. Of course, since the combined light does not contain red and green components, it is not actually white light. However, the light produced is so close to being white, the fact that the light is not actually white is not visually discernable to the human eye. Therefore, the light emitted by the LED device 1 of the present invention will hereinafter be referred to as white light, although it will be understood that the light produced is not actually pure white light in some cases.

The characteristics of the substrate 10 are capable of being precisely controlled so that the fraction of primary light that passes through the substrate 10 without being converted is predictable and controllable. The characteristics of the substrate 10 are precisely controlled by precisely controlling the doping of the YAG with rare earth ions, such as Cerium ions, for example. Those skilled in the art will understand the manner in which the YAG can be grown and doped with rare earth ions to achieve these goals of predictability and controllability. By precisely controlling the characteristics of the substrate 10, the fraction of primary light that is converted by the substrate 10 into yellow light is predictable and controllable. By precisely controlling this fraction, variations in the quality of the white light produced can be minimized or eliminated.

Figure 2:
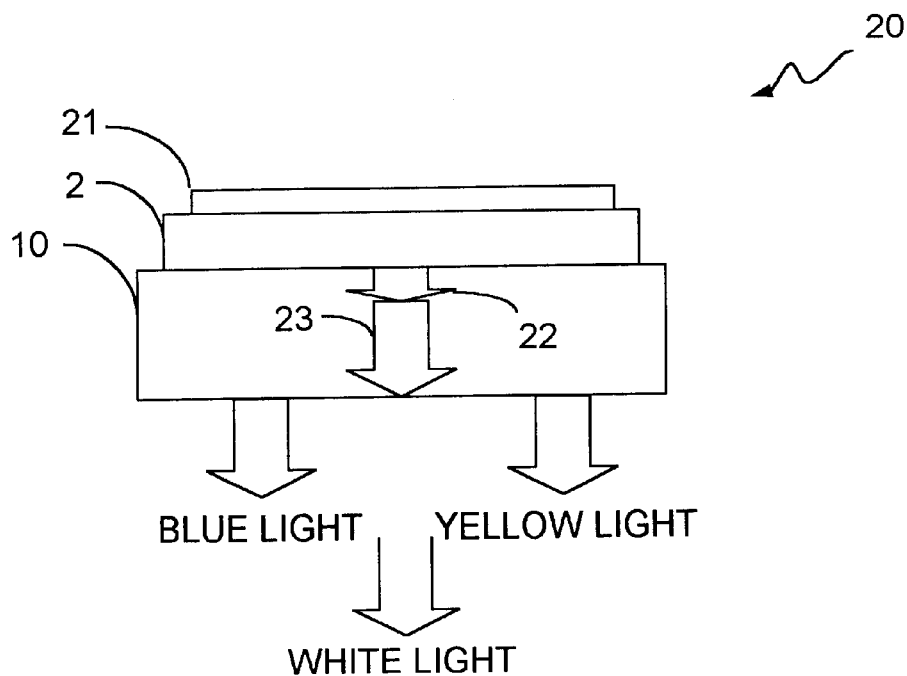
FIG. 2 is a side view of the light emitting diode device of the present invention in accordance with one embodiment wherein the substrate is comprised as a single-crystal phosphor which absorbs only a portion of the primary radiation emitted by the light emitting structure of the light emitting diode device.

FIG. 2 is a side view of the LED device of the present invention in accordance with one embodiment. As stated above with reference to FIG. 1, the LED device 20 comprises a substrate 10 and a light emitting structure 2. In accordance with this embodiment of the present invention, a reflective electrode 21 is disposed on the surface of the light emitting structure 2 opposite the surface of the light emitting structure 2 that is in contact with the substrate 10. The reflective electrode 21 corresponds to the electrode 12 shown in FIG. 1. For ease of illustration, the other components of the light emitting structure 2 are not shown in FIG. 2.

Some of the primary light emitted by the light emitting structure 2 may impinge on the reflective electrode 21, which will reflect the primary light back through the light emitting structure 2 and through the substrate 10. A fraction of the primary light that propagates into the substrate is converted by the substrate 10 into yellow light. A fraction of the primary light that propagates into the substrate 10 is not converted into yellow light. The yellow light emitted by the substrate 10 combines with the unconverted primary light to produce white light. Utilizing a reflective electrode improves the efficiency of the LED device 20 by ensuring that the amount of primary light entering the substrate 10 is maximized.

It should be noted that the primary light may comprise light having more than one wavelength. Similarly, the light emitted in response to excitation by the primary light may comprise light of more than one wavelength. For example, the yellow light emitted by the substrate 10 may correspond to a plurality of wavelengths making up a spectral band. Wavelengths of both of this spectral band may then combine with the unconverted primary light to produce white light. Therefore, although individual wavelengths are discussed herein for purposes of explaining the concepts of the present invention, it will be understood that the excitation being discussed herein may result in a plurality of wavelengths, or a spectral band, being emitted. Wavelengths of the spectral bands may then combine to produce white light. Therefore, the term "spectral band" is intended to denote a band of at least one wavelength and of potentially many wavelengths, and the term "wavelength" is intended to denote the wavelength of the peak intensity of a spectral band.

Figure 3:
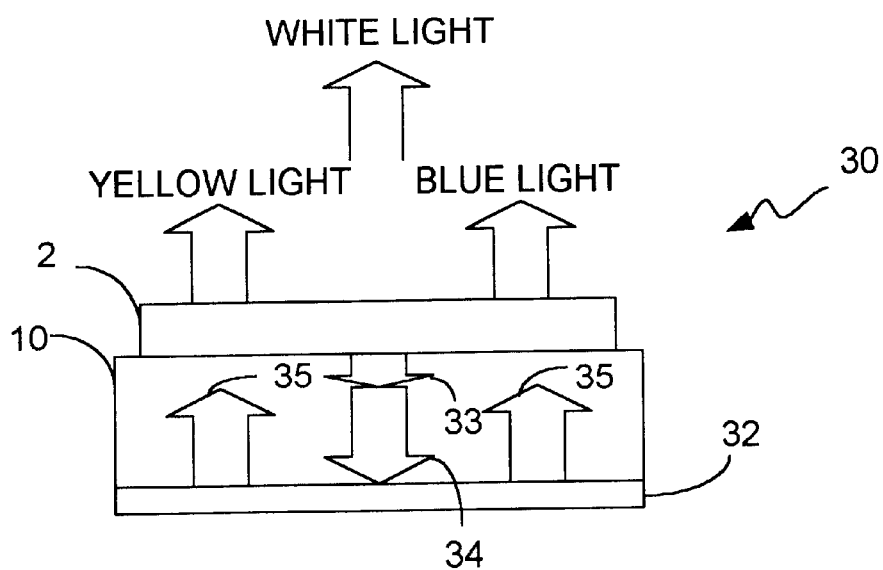
FIG. 3 is a side view of the light emitting diode device of the present invention in accordance with another embodiment wherein the substrate is comprised as a single-crystal phosphor which absorbs substantially all of the primary radiation emitted by the light emitting structure of the light emitting diode device.

FIG. 3 is a side view of the LED device 30 of the present invention in accordance with another embodiment. In accordance with this embodiment of the present invention, a reflective surface 32 is disposed on the surface of the substrate 10 opposite the light emitting structure 2. The primary light emitted by the light emitting structure 2 propagates into the substrate 10. The arrow 33 represents the primary light, which is blue light, that propagates into the substrate 10. All of the primary light is converted into yellow light by the substrate 10. The yellow light is represented by arrow 34. The yellow light is reflected by the reflective surface 32 in a direction away from the reflective surface 32 toward the light emitting structure 2. The reflected yellow light is represented by arrows 35. The reflected yellow light passes through the light emitting structure 2 and combines with the blue light emitted by the light emitting structure 2 in a direction away from the substrate 10 to produce white light.

Those skilled in the art will understand that the present invention is not limited to the embodiments discussed herein. Those skilled in the art will understand that modifications may be made to the embodiments discussed herein without deviating from the spirit and scope of the present invention.

What is claimed is:

1. A light emitting diode device for generating white light, the light emitting diode device comprising:

a light emitting structure, the light emitting structure emitting primary radiation of a particular wavelength when driven; and a light-transmissive substrate comprising a Yttrium-Aluminum-oxide compound, at least a portion of the primary radiation emitted from the light emitting structure propagating into the substrate, the substrate being doped in such a manner that at least a portion of the primary radiation propagating into the substrate is converted into radiation of one or more other wavelengths, and wherein a portion of the primary radiation emitted by the light emitting structure is not converted into said radiation of one or more other wavelengths, and wherein the unconverted portion of the primary radiation combines with said radiation of one or more other wavelengths to produce white light.

2. The light emitting diode device of claim 1, further comprising:

a reflective surface, the light-transmissive substrate being sandwiched between the light emitting structure and the reflective surface, wherein substantially all of the primary radiation propagating into the substrate is converted into the radiation of one or more other wavelengths, and wherein the unconverted portion of the primary radiation corresponds to primary radiation emitted by the light emitting structure in a direction away from the substrate, the reflective surface reflecting the radiation of one or more other wavelengths through the substrate and the light emitting structure, the reflected radiation and the unconverted primary radiation combining to form white light.

3. The light emitting diode device of claim 1, further comprising:

a reflective electrode disposed on a first surface of the light emitting structure, wherein any primary radiation emitted by the light emitting structure that impinges on the reflective electrode is reflected by the reflective electrode toward the light emitting structure such that the reflected radiation is directed toward the substrate.

4. The light emitting diode device of claim 1, wherein the primary radiation is blue light.

5. The light emitting diode device of claim 1, wherein said light-transmissive substrate is doped with at least one of Cerium, Praseodymium, Holmium, Ytterbium, and Europium.

6. The light emitting diode device of claim 1, wherein the primary radiation includes ultraviolet light.

7. A light emitting diode device for generating white light, the light emitting diode device comprising:

a light emitting structure, the light emitting structure emitting primary radiation of a particular wavelength when driven; and a light-transmissive substrate comprising an Aluminum-rare earth ion-oxide compound, at least a portion of the primary radiation emitted from the light emitting structure propagating into the substrate, the substrate being doped in such a manner that at least a portion of the primary radiation propagating into the substrate is converted into radiation of one or more other wavelengths, and wherein a portion of the primary radiation emitted by the light emitting structure is not converted into said radiation of one or more other wavelengths, and wherein the unconverted portion of the primary radiation combines with said radiation of one or more other wavelengths to produce white light.

8. The light emitting diode device of claim 7, further comprising:

a reflective surface, the light-transmissive substrate being sandwiched between the light emitting structure and the reflective surface, wherein substantially all of the primary radiation propagating into the substrate is converted into the radiation of one or more other wavelengths, and wherein the unconverted portion of the primary radiation corresponds to primary radiation emitted by the light emitting structure in a direction away from the substrate, the reflective surface reflecting the radiation of one or more other wavelengths through the substrate and the light emitting structure, the reflected radiation and the unconverted primary radiation combining to form white light.

9. The light emitting diode device of claim 7, further comprising:

a reflective electrode disposed on a first surface of the light emitting structure, wherein any primary radiation emitted by the light emitting structure that impinges on the reflective electrode is reflected by the reflective electrode toward the light emitting structure such that the reflected radiation is directed toward the substrate.

10. The light emitting diode device of claim 7, wherein at least a portion of said radiation of one or more other wavelengths is yellow light, and wherein the yellow light combines with the unconverted primary radiation to produce white light.

11. The light emitting diode device of claim 7, wherein the primary radiation is blue light.

12. The light emitting diode device of claim 7, wherein the single crystal Yttrium Aluminum-Garnet compound is doped with Cerium to produce a compound chemically defined as $Y_3Al_5O_{12}:Ce^{3+}$.

13. The light emitting diode device of claim 7, wherein the single crystal Yttrium Aluminum-Garnet compound is doped with Holmium to produce a compound chemically defined as $Y_3Al_5O_{12}:Ho^{3+}$.

14. The light emitting diode device of claim 7, wherein the single crystal Yttrium Aluminum-Garnet ($Y_3Al_5O_{12}$) compound is doped with Praseodymium to produce a compound chemically defined as $Y_3Al_5O_{12}:Pr^{3+}$.

15. The light emitting diode device of claim 7, wherein the substrate further comprises a Yttrium-Aluminum-rare earth ion-oxide.

16. The light emitting diode device of claim 15, wherein said Yttrium-Aluminum-rare earth ion-oxide is Yttrium-Aluminum-Lutethium-Oxide.

17. The light emitting diode device of claim 15, wherein said Yttrium-Aluminum-rare earth ion-oxide is Yttrium-Aluminum-Lutethium-Gallium-Oxide.

18. The light emitting diode device of claim 7, wherein said light-transmissive substrate is doped with at least one of Cerium, Praseodymium, Holmium, Ytterbium, and Europium.

19. The light emitting diode device of claim 7, wherein the primary radiation includes ultraviolet light.

20. A light emitting diode device for generating white light, the light emitting diode device comprising:

a light emitting structure, the light emitting structure emitting primary radiation of a particular wavelength when driven; and a light-transmissive substrate comprised of a non-garnet Yttrium-Aluminum-Oxide, at least a portion of the primary radiation emitted from the light emitting structure propagating into the substrate, the substrate being doped in such a manner that at least a portion of the primary radiation propagating into the substrate is converted into radiation of one or more other wavelengths, and wherein a portion of the primary radiation emitted by the light emitting structure is not converted into said radiation of one or more other wavelengths, and wherein the unconverted portion of the primary radiation combines with said radiation of one or more other wavelengths to produce white light.

21. The light emitting diode device of claim 20, wherein the light-transmissive substrate comprises monoklinic YAlO.

22. The light emitting diode of claim 20, wherein the light-transmissive substrate comprises YAlO-perovskite.

23. The light emitting diode device of claim 20, wherein said light-transmissive substrate is doped with at least one of Cerium, Praseodymium, Holmium, Ytterbium, and Europium.

24. A light emitting diode device for generating white light, the light emitting diode device comprising:

a light emitting structure, the light emitting structure emitting primary radiation of a particular wavelength when driven; and a light-transmissive substrate comprised of an Aluminum-rare earth ion-oxide compound, at least a portion of the primary radiation emitted from the light emitting structure propagating into the substrate, the substrate being doped in such a manner that at least a portion of the primary radiation propagating into the substrate is converted into radiation of one or more other wavelengths, and wherein a portion of the primary radiation emitted by the light emitting structure is not converted into said radiation of one or more other wavelengths, and wherein the unconverted portion of the primary radiation combines with said radiation of one or more other wavelengths to produce white light.

25. The light emitting diode device of claim 24, wherein the substrate comprises a Yttrium-Aluminum-rare earth ion-oxide.

26. The light emitting diode device of claim 25, wherein said Yttrium-Aluminum-rare earth ion-oxide.

27. The light emitting diode device of claim 25, wherein said Yttrium-Aluminum-rare earth ion-oxide is Yttrium-Aluminum-Lutethium-Gallium-oxide.

28. The light emitting diode device of claim 25, wherein the primary radiation is blue light.

29. The light emitting diode device of claim 25, wherein the primary radiation includes ultraviolet light.

30. The light emitting diode device of claim 25, wherein the light-transmissive substrate is doped with at least one of Cerium, Praseodymium, Holmium, Ytterbium, and Europium.

* * * * *

UNITED STATES PATENT AND TRADEMARK OFFICE
CERTIFICATE OF CORRECTION

PATENT NO. : 6,630,691 B1 Page 1 of 1
DATED : October 7, 2003
INVENTOR(S) : Regina B. Mueller-Mach, Gerd O. Mueller and David A. Vanderwater It is certified that error appears in the above-identified patent and that said Letters Patent is hereby corrected as shown below:

Column 7,
Lines 51-52, cancel "comprising an Aluminum-rare earth ion-oxide" and substitute
-- comprised of a single crystal Yttrium-Aluminum-Garnet --.

Column 10,
Line 14, after the words "Yttrium-Aluminum-rare earth ion-oxide" please insert
-- is Yttrium-Aluminum-Lutethium-oxide --.

Signed and Sealed this

Twentieth Day of January, 2004

JON W. DUDAS
*Acting Director of the United States Patent and Trademark Office*